(12) United States Patent
Li et al.

(10) Patent No.: US 9,450,540 B2
(45) Date of Patent: Sep. 20, 2016

(54) METHODS AND APPARATUS FOR CALIBRATING FOR TRANSCONDUCTANCE OR GAIN OVER PROCESS OR CONDITION VARIATIONS IN DIFFERENTIAL CIRCUITS

(71) Applicant: QUALCOMM Incorporated, San Diego, CA (US)

(72) Inventors: Miao Li, San Diego, CA (US); Li Sun, San Diego, CA (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/595,106

(22) Filed: Jan. 12, 2015

(65) Prior Publication Data

US 2016/0204749 A1    Jul. 14, 2016

(51) Int. Cl.
| | |
|---|---|
| *H03F 3/45* | (2006.01) |
| *H03F 1/30* | (2006.01) |
| *H03G 3/30* | (2006.01) |
| *H03K 19/003* | (2006.01) |
| *H03K 19/0185* | (2006.01) |

(52) U.S. Cl.
CPC ............ *H03F 1/30* (2013.01); *H03F 3/45076* (2013.01); *H03F 3/45183* (2013.01); *H03G 3/3036* (2013.01); *H03K 19/00384* (2013.01); *H03K 19/018528* (2013.01); *H03F 2200/447* (2013.01); *H03F 2203/45116* (2013.01); *H03F 2203/45244* (2013.01)

(58) Field of Classification Search
CPC .................................. H03F 3/45; H03G 3/30
USPC ............................................. 330/2, 254, 261
See application file for complete search history.

(56) References Cited

U.S. PATENT DOCUMENTS

| | | | |
|---|---|---|---|
| 6,252,458 B1 | 6/2001 | Shibata | |
| 6,480,064 B1 | 11/2002 | Cyrusian | |
| 6,737,919 B2 | 5/2004 | Cyrusian | |
| 6,753,732 B1 | 6/2004 | Moreland | |
| 7,042,289 B2 * | 5/2006 | Hwang | ............... H03F 3/45183 330/253 |
| 7,429,889 B2 | 9/2008 | Kasperkovitz | |
| 8,620,249 B2 | 12/2013 | Darabi | |
| 2002/0089378 A1 | 7/2002 | Wu | |
| 2005/0007160 A1 | 1/2005 | Neff | |
| 2006/0055444 A1 | 3/2006 | Ogasawara | |

OTHER PUBLICATIONS

International Search Report and Written Opinion—PCT/US2015/065358—ISA/EPO—Mar. 4, 2016.

* cited by examiner

*Primary Examiner* — Steven J Mottola
(74) *Attorney, Agent, or Firm* — Arent Fox LLP

(57) ABSTRACT

An apparatus is provided. The apparatus includes a calibration circuit configured to generate a reference signal and at least one differential circuit each being configured to operate at a calibrated transconductance over process or condition variations based on the reference signal. The calibration circuit may be configured to generate the reference signal independent of the at least one differential circuit. A method for operating at least one differential circuit is provided. The method includes generating a reference signal and operating the at least one differential circuit at a calibrated transconductance or gain over process or condition variations based on the reference signal. The reference signal may be generated independently of the at least one differential circuit.

24 Claims, 4 Drawing Sheets

METHODS AND APPARATUS FOR CALIBRATING FOR TRANSCONDUCTANCE OR GAIN OVER PROCESS OR CONDITION VARIATIONS IN DIFFERENTIAL CIRCUITS

BACKGROUND

1. Field

The disclosure relates generally to electronic circuits, and in particular, to apparatuses and methods for calibrating transconductance or gain of differential circuits.

2. Background

Differential logic families are gaining popularity in apparatuses and processors for wireless communication. Wireless apparatuses such as tablet computers and cell phones may adopt processors utilizing the differential logic circuits due to certain advantages. Examples of the differential logic families may include common-mode logic (CML) and low-voltage differential signaling (LVDS) circuits (e.g., gates).

These differential circuits offer advantages of, for example, high speed data communication with limited voltage swings. These differential circuits may be suitable for applications such as Serializer/Deserializer (SerDes) interfaces.

One design challenge for adopting the differential circuits is to operate these circuits over process or condition variations (such as variations in voltage and/or temperature; collectively PVT variations).

SUMMARY

Aspects of an apparatus are provided. The apparatus includes a calibration circuit configured to generate a reference signal and at least one differential circuit each being configured to operate at a calibrated transconductance over process or condition variations based on the reference signal. The calibration circuit may be configured to generate the reference signal independent of the at least one differential circuit.

Aspects of a method for operating at least one differential circuit are provided. The method includes generating a reference signal and operating the at least one differential circuit at a calibrated transconductance over process or condition variations based on the reference signal. The reference signal may be generated independently of the at least one differential circuit.

Aspects of another apparatus are provided. The apparatus includes a calibration circuit configured to generate a reference signal and at least one differential circuit each being configured to operate at a calibrated gain over process or condition variations based on the reference signal.

Aspects of another method for operating at least one differential circuit are provided. The method includes generating a reference signal and operating the at least one differential circuit at a calibrated gain over process or condition variations based on the reference signal.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

DETAILED DESCRIPTION

Figure 1:
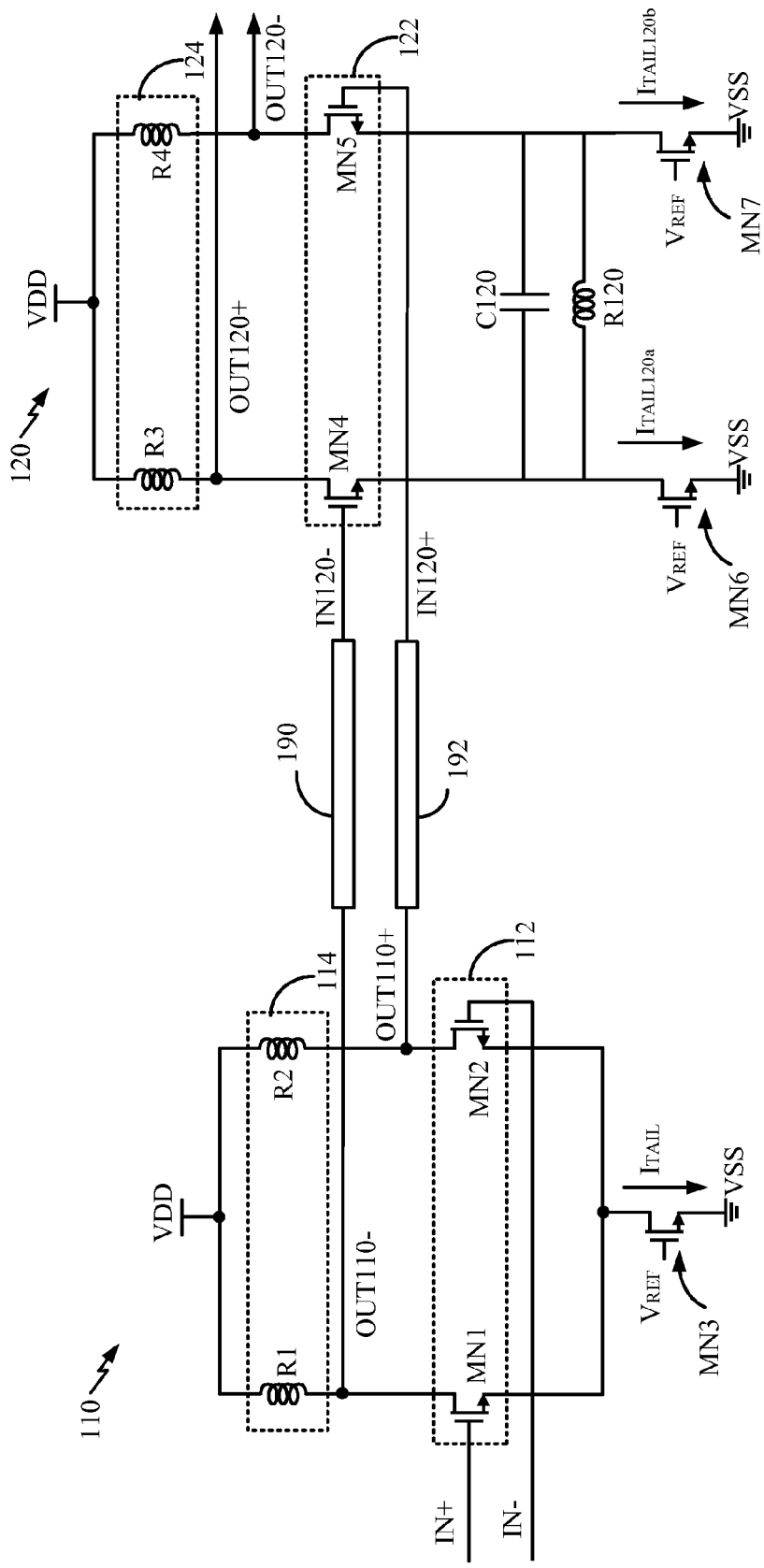
FIG. 1 is a schematic diagram of an exemplary embodiment of differential circuits

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The term "apparatus" shall be construed to include any integrated circuit or system, or any portion of an integrated circuit or system. (e.g., components, circuits, or the like residing in an integrated circuit or part of a system). The term "apparatus" shall also be construed to include any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, or the like). The term "method" shall similarly be construed to include the operation of any integrated circuit or system, or any portion of an integrated circuit or system, or any intermediate product or end product, or any step, process, algorithm, or the like, or any combination thereof performed by such integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. A reference to a signal may be referred to the underlying signal line (e.g., a metal line on an IC) carrying the signal. A reference to a resistor may likewise be used to refer to the resistance of said resistor.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of apparatuses and methods for a calibration circuit configured to generate a reference signal for calibrating one or more differential circuits will be presented. An example of a differential circuit is a CML buffer incorporating a differential pair of transistors, which may be widely used in high-speed backplane applications such as data buffers, source-degenerated resistance-capacitance equalizers, and input buffers for decision-feedback equalizers. The output loading resistances of the CML buffer may be calibrated to be constant over PVT variations. However, the gain of the CML buffer may still vary because the transconductance of the differential pair may vary with the PVT variations. With the varying gain, the incoming signals may be amplified at an unpredictable gain. Extra design effort or trade-offs may be needed in order for the incoming signals to be processed properly for the next stage. Various aspects of apparatuses and methods will be presented to efficiently calibrate the performance of multiple CML buffers globally in terms of power, area, and circuit complexity.

As those skilled in the art will readily appreciate, the various aspects presented throughout this disclosure may not be limited thereto. For example, the features presented may be applicable to LVDS logic gates and the differential logic circuits in general. Moreover, the differential logic gates or circuits are not limited to buffer and/or SerDes applications. Accordingly, all references to a specific application for the presented apparatus or method are intended only to illustrate exemplary aspects of the apparatus or method with the understanding that such aspects may have a wide differential of applications.

FIG. 1 is a schematic diagram of an exemplary embodiment of differential circuits. The differential circuits include, for example, a CML buffer 110 and a continuous time linear equalizers (CTLE) 120. The CML buffer 110 provides data to the CTLE 120. In the exemplary embodiment, the CML buffer 110 and the CTLE 120 are examples of differential circuits, each of which incorporating a differential pair of transistors. In one example, the CML buffer 110 and the CTLE 120 are suitable for SerDes applications.

The CML buffer 110 includes a differential pair of transistors 112, which includes N-type transistors MN1 and MN2. The differential pair of transistors 112 receives the differential input IN+ and IN−. A pull-down transistor MN3 generates a tail current $I_{TAIL}$ based on the reference signal $V_{REF}$. In the exemplary embodiment, the reference signal $V_{REF}$ is a bias voltage controlling the tail current $I_{TAIL}$. The tail current $I_{TAIL}$ is discharged to VSS or ground. As is known in the art, a transconductance or $g_m$, may be characterized as a current gain of the differential input IN+ and IN−. Each of the N-type transistors MN1 and MN2 drives a portion of the tail current $I_{TAIL}$ based on the transconductance and the differential input IN+ and IN−. The CML buffer 110 includes load resistors R1 and R2 coupled to a power source VDD (e.g., voltage source VDD), and output voltages OUT110+ and OUT110− are generated based on the currents flowing through the N-type transistors MN1 and MN2 and the resistances of the resistors R1 and R2. A gain (e.g., voltage gain) of the CML buffer 110 may be a ratio of the output voltages OUT110+ and OUT110− and the differential input IN+ and IN−.

In this example, the CML buffer 110 drives the output voltages OUT110+ and OUT110− through traces 190 and 192 on a printed circuit board. The CTLE 120 receives the output voltages of the CML buffer 110 as the differential input IN120+ and IN120−. The CTLE 120 includes a differential pair of transistors 122, which includes N-type transistors MN4 and MN5, and load resistors R3 and R4 coupled to a power source VDD. The CTLE 120 generates tail currents $I_{TAIL120a}$ and $I_{TAIL120b}$ through N-type transistors MN6 and MN7, respectively, based on the reference signal $V_{REF}$. The tail currents $I_{TAIL120a}$ and $I_{TAIL120b}$ are discharged to VSS or ground. The CTLE 120 further includes a capacitor C120 and a resistor R120 for providing a filter function. The CTLE 120 provides equalized outputs OUT120+ and OUT120− in accordance with the knowledge of persons or ordinary skill in the art. The CTLE 120 may have transconductance (or gm) and a voltage gain as described above.

Figure 2:
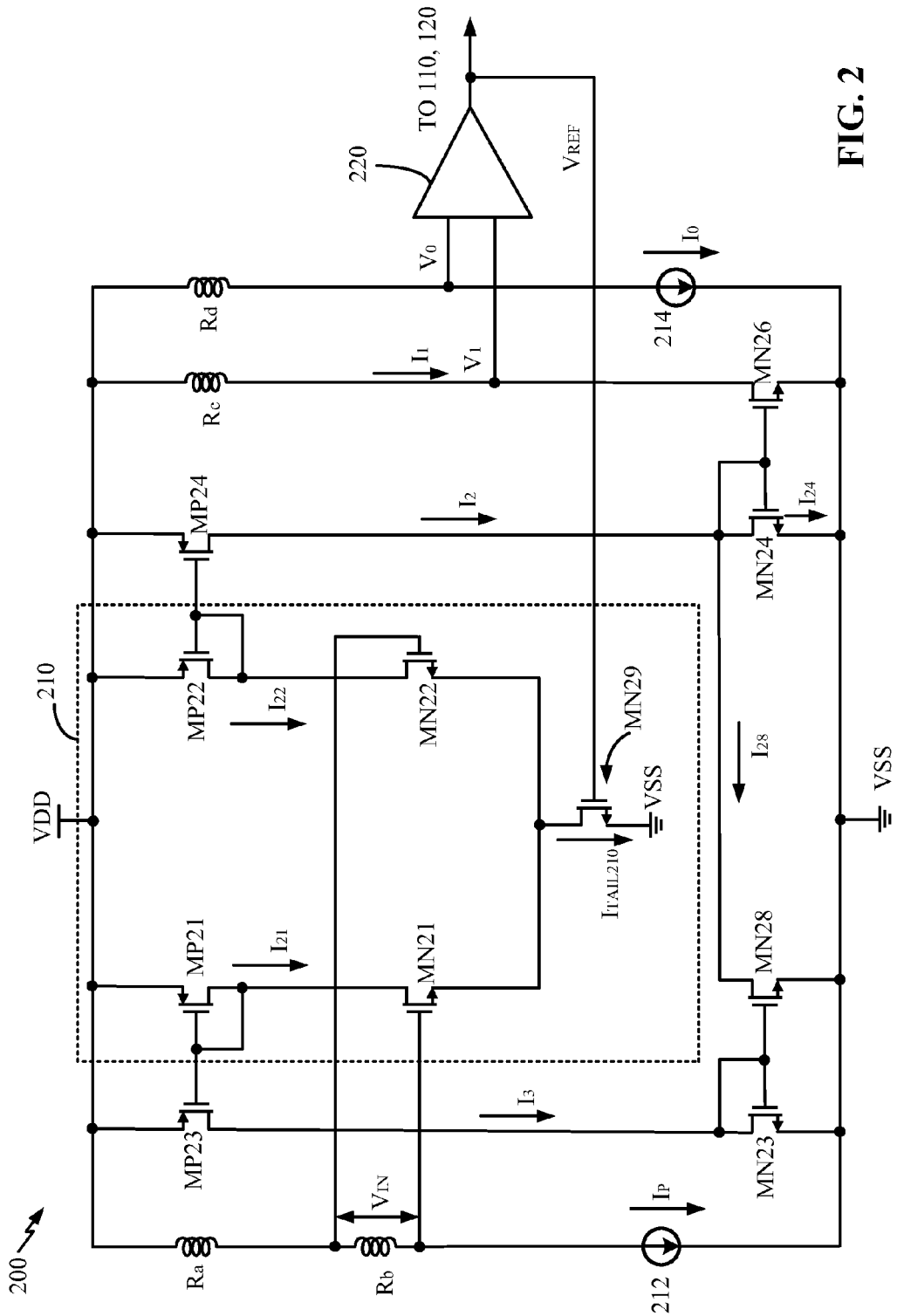
FIG. 2 is a schematic diagram of an exemplary embodiment of a calibration circuit that generates a reference signal for differential circuits.

FIG. 2 is a schematic diagram of an exemplary embodiment of a calibration circuit 200 that generates a reference signal for differential circuits (such as the CML buffer 110 and the CTLE 120). In the exemplary embodiment, the reference signal is the $V_{REF}$ supplied to the CML buffer 110 and the CTLE 120 (or other types of differential circuits). The calibration circuit 200 provides the means to generate the reference signal $V_{REF}$ supplied to the CML buffer 110 and the CTLE 120 without receiving any feedback from the CML buffer 110 and the CTLE 120. Thus, the calibration circuit 200 generates the reference signal $V_{REF}$ independent of the CML buffer 110 and the CTLE 120. As an example, such feature allows the calibration circuit 200 to generate and to provide the reference signal $V_{REF}$ to multiple differential circuits without the need to manage the multiple feedbacks. Moreover, the complexity of routing the multiple feedbacks is eliminated.

As described with FIG. 1, a differential circuit, such as the CML buffer 110 or the CTLE 120, provides means to operate at a calibrated transconductance or a calibrated gain based on the received reference signal $V_{REF}$. For example, the reference signal $V_{REF}$ controls the generation of a tail current in the CML buffer 110 or the CTLE 120, and therefore, the transconductance and the gain of the CML buffer 110 or the CTLE 120 may be controlled by or based on the reference signal $V_{REF}$. By calibrating the reference signal $V_{REF}$, the calibration circuit 200 may effect the CML buffer 110 or the CTLE 120 to operate at a calibrated transconductance or gain. Thus, the CML buffer 110 or the CTLE 120 may be configured to operate at the calibrated transconductance or gain based on the reference signal $V_{REF}$. These features are described in more detail below.

The calibration circuit 200 includes an operational transconductance amplifier (OTA) 210. The OTA 210 provides means to receive a feedback of the reference signal $V_{REF}$, and the calibration circuit 200 generates the reference signal $V_{REF}$ based on the received feedback of the reference signal $V_{REF}$. The OTA 210 includes a differential pair of transistors MN21 and MN22 (both N-type transistors). A pull-down N-type transistor MN29 provides, in one example, means to receive the feedback of the reference signal $V_{REF}$ and to generate a tail current $I_{TAIL210}$ based the reference signal $V_{REF}$. The tail current $I_{TAIL210}$ flows through the differential pair of transistors MN21 and MN22 and is discharged to VSS or ground. The P-type transistors MP21 and MP22 coupled to a power source VDD (e.g., voltage source) provides the loading for the OTA 210.

The calibration circuit 200 further includes resistors $R_a$ and $R_b$ and a current source 212. The current source 212 provides a current $I_P$, and a voltage $V_{IN}$ is generated based on the current $I_P$ and the resistance of the resistor $R_b$. The resistor $R_b$ provides means (e.g., circuit) to convert the current $I_P$ to the voltage $V_{IN}$. The current $I_P$ is an example of a reference current utilized by the calibration circuit 200 in generating the reference signal $V_{REF}$. The voltage $V_{IN}$ is an example of a reference voltage utilized by the calibration circuit 200 in generating the reference signal $V_{REF}$. The OTA 210 (e.g., the differential pair MN21 and MN22) receives the voltage $V_{IN}$ and generates a current $I_{21}$ through the P-type transistor MP21 and the N-type transistor MN21 and a current $I_{22}$ through the P-type transistor MP22 and the N-type transistor MN22. The current $I_{21}$ and the current $I_{22}$ are outputs of the OTA 210 and are generated based on a transconductance of the OTA 210, which is based on the tail current $I_{TAIL210}$ as is known in the art.

A voltage $V_1$ is generated based on the current $I_{21}$ and the current $I_{22}$ (and therefore, based on the outputs of the OTA 210) as presented below. The P-type transistors MP23 and MP21 form a current mirror, and therefore, the current $I_3$ flowing through the P-type transistor MP23 and the N-type transistor MN21 mirrors the current $I_{21}$. The N-type transistors MN23 and MN28 form a current mirror, and therefore, the current $I_{28}$ flowing through the MN28 mirrors or equals to the current $I_3$. The P-type transistors MP22 and MP22 form a current mirror, and therefore, the current $I_2$ flowing through the P-type transistor MP22 and the N-type transistor MN22 mirrors the current $I_{22}$. The current $I_2$ includes the current $I_{28}$ and the current $I_{24}$, which flows through the N-type transistor MN24. Thus, the current $I_{24}$ may be described as $I_2 - I_{28}$, or $I_2 - I_3$. The N-type transistors MN24 and MN26 form a current mirror, and therefore, the current $I_1$ flowing through the MN26 mirrors or equals to the current $I_{24}$. The voltage $V_1$ is determined based on the resistor Rc and the current $I_1$ (i.e., $I_2 - I_3$ or $I_{22} - I_{21}$). Thus, the voltage $V_1$ is determined based on the OTA outputs $I_{22}$ and $I_{21}$.

A current source 214 generates a current $I_0$ flowing through the resistor Rd. The voltage $V_0$ is based on the current $I_0$ and the resistor Rd. The current source 212 provides a current $I_P$, and a voltage $V_{IN}$ is generated based on the current $I_P$ and the resistance of the resistor $R_b$. The current $I_0$ is an example of a reference current utilized by the calibration circuit 200 in generating the reference signal $V_{REF}$. The voltage $V_0$ is an example of a reference voltage utilized by the calibration circuit 200 in generating the reference signal $V_{REF}$. An operational amplifier 220 compares the voltages $V_1$ and $V_0$, and outputs the reference signal $V_{REF}$ to differential circuits, such as the CML buffer 110 and/or the CTLE 120. The reference signal $V_{REF}$ is fed back to the MN29 of the OTA 210 to control the current $I_{TAIL210}$ (and therefore, the transconductance of the OTA 210).

As described above, the OTA 210 converts a small signal voltage drop $V_{IN}$ into a current difference $I_1$ (i.e., $I_2 - I_3$ or $I_{22} - I_{21}$). This current difference is converted to the voltage $V_1$ by a resistance (Rc). The voltage $V_1$ is compared to a reference voltage $V_0$ by the operational amplifier 220, which generates the reference signal $V_{REF}$ based on the comparison. The reference signal $V_{REF}$ is provided to the differential circuits (e.g., the CML buffer 110 and/or the CTLE 120) as a bias voltage to generate a tail current in each of the differential circuits. The reference signal $V_{REF}$ feeds back to the OTA 210 as the bias voltage to generate the tail current $I_{TAIL210}$. The feedback of the reference signal $V_{REF}$ allows the calibration circuit 200 to calibrate the reference signal $V_{REF}$ for PVT variations. The calibration circuit 200 may thereby control the differential circuits (e.g., the CML buffer 110 and/or the CTLE 120) to operate at a target transconductance or a target voltage gain, by adjusting the tail current thereof (e.g., by adjusting the reference signal $V_{REF}$). In one example, the transconductance of the differential circuits (e.g., the CML buffer 110 and/or the CTLE 120) may be made to mirror the transconductance of the OTA 210. In this fashion, the calibration circuit 200 calibrates the reference signal $V_{REF}$ for the OTA 210 as well as the differential circuits receiving the reference signal $V_{REF}$. These features are further demonstrated below.

In the exemplary embodiment, the current $I_P$ may be generated from, for example, a bandgap voltage ($V_{bg}$) supply located off chip from the calibration circuit 200. This example is provided for demonstration only, and the scope of the present disclosure is certainly not limited thereto. As is known in the art, the bandgap voltage $V_{bg}$ is constant over the PVT variations. In this example, the current $I_P$ may be described as follows:

$$I_P = V_{bg}/R_{on\text{-}chip},$$

where the resistance $R_{on\text{-}chip}$ is the on-chip portion of the resistance, including the resistor $R_b$. Since the resistance of the resistor $R_b$ is subject to the PVT variations, the current $I_P$ likewise varies over the PVT variations. The resistor $R_b$ may be provided as a ratio of the total resistance $R_{on\text{-}chip}$ (e.g., a portion thereof). Thus, the resistance of the resistor $R_b$ may be expressed as:

$$R_b = K_b \times R_{on\text{-}chip},$$

where the $K_b$ is a constant (e.g., a ratio of $R_b$ to $R_{on\text{-}chip}$).

Accordingly, the voltage $V_{IN}$ may be expressed as $I_P \times R_b$ or as follows (substituting the expression for $I_P$ and $R_b$ shown above):

$$V_{IN} = K_b \times V_{bg}.$$

Accordingly, the voltage $V_{IN}$ may remain constant over the PVT variations. In this fashion, the calibration circuit 200 may keep the voltage $V_{IN}$ constant over the PVT variations.

Moreover, a gain (e.g., voltage gain) of the OTA 210 may be expressed as:

$$\text{gain} = g_{MN}/g_{MP},$$

where the $g_{MN}$ denotes the transconductance of the N-type transistors MN21 and MN22, and the $g_{MP}$ denotes the transconductance of the P-type transistors MP21 and MP22. An output voltage $V_{OUT}$ of the OTA 210 may be expressed as:

$$V_{OUT} = \text{gain} \times V_{IN},$$

and the output current $I_{OUT}$ of the OTA 210 may be expressed as:

$$I_{OUT} = g_{MP} \times V_{OUT}, \text{ or its equivalent}$$

$$I_{OUT} = g_{MP} \times (g_{MN}/g_{MP} \times V_{IN}), \text{ or, finally,}$$

$$I_{OUT} = g_{MN} \times K_b \times V_{bg} = I_2 - I_3 = I_1.$$

The reference signal $V_{REF}$ feeds back to the OTA 210 (MN29), and the OTA 210 is stabilized when voltages $V_0$ and $V_1$ are equal. Thus, $$I_1 \times R_c = I_0 \times R_d,$$

where $R_c$ and $R_d$ may be expressed as:

$$R_c = K_c \times R_{on\text{-}chip}, \text{ and } R_d = K_d \times R_{on\text{-}chip}.$$

In other words, the resistors $R_c$ and $R_d$ may be expressed as portions of the total on-chip resistance $R_{on\text{-}chip}$, and $K_c$ and $K_d$ are constants denoting the portions.

The current $I_1$ and the transconductance $g_{MN}$ may this be expressed as:

$$I_1 = K_d/K_c \times I_0, \text{ and}$$

$$g_{MN} = (K_d/K_c \times I_0)/(K_b \times V_{bg}).$$

In one exemplary embodiment, the calibration circuit 200 may utilize the current $I_0$ to generate a constant transconductance $g_{MN}$ over the PVT variations. A constant current $I_0$ over the PVT variations may be generated as is known in the art. In one example, the constant current $I_0$ may be generated using the bandgap voltage $V_{bg}$ and an off-chip resistance $R_{off\text{-}chip}$ designed to be constant over the PVT variations. The resulting current $I_0$, $$I_0 = V_{bg}/R_{off\text{-}chip},$$

is likewise constant over the PVT variations. In one example, the ratio $K_d/K_c$ may be set at ½. The current $I_0$ may be set at 50 uA. The value of $K_b \times V_{bg}$ may be set at 50 mV. In this example, the transconductance $g_{MN}$ is 0.5 m and is a constant value over the PVT variations.

In one exemplary embodiment, the current $I_0$ may be generated to not be compensated for the PVT variations (e.g., the current $I_0$ varies over the PVT variations). The transconductance $g_{MN}((K_d/K_c \times I_0)/(K_b \times V_{bg}))$ likewise varies over the PVT variations, since the resistance of $R_{on\text{-}chip}$ varies over the PVT variations. In the exemplary embodiment, the calibration circuit 200 may utilize the reference signal $V_{REF}$ to effect the differential circuits, such as the CML buffer 110, to operate at a target gain which is constant over the PVT variations. A gain of the CML buffer 110 ($gain_{110}$) may be described as follows:

$$gain_{110} = g_{MN} \times R_L,$$

where the load resistor $R_L$ may be the resistors $R_1$ or $R_2$ of FIG. 1, and may be designed to be a portion of the resistance $R_{on\text{-}chip}$. Accordingly, $I_P \times R_L$ may be a constant over PVT variations. The $gain_{110}$ may be further described as follows:

$$gain_{110} = (K_d/K_c \times I_P \times R_L)/(K_b \times V_{bg}).$$

The value of $R_L$ may be proportional to the resistance $R_{on\text{-}chip}$. Since the value of $I_P$ is based on $R_{on\text{-}chip}$, the value of the $I_P \times R_L$ may thus be constant over the PVT variations. One aspect of the $gain_{110}$ thus provides that the gain is proportional to the current $I_P$. As shown above, the target gain of the CML buffer 110, $gain_{110}$, may be calibrated to a constant over the PVT variations. In one example, the ratio of $K_b/K_c$ may be set at ½. The value of $I_P \times R_L$ may be set at 200 mV. $V_{IN}$ (e.g., $K_b \times V_{bg}$) may be set at 50 mV. In this example, the $gain_{110}$ is 6 dB and is constant over the PVT variations.

Figure 3:
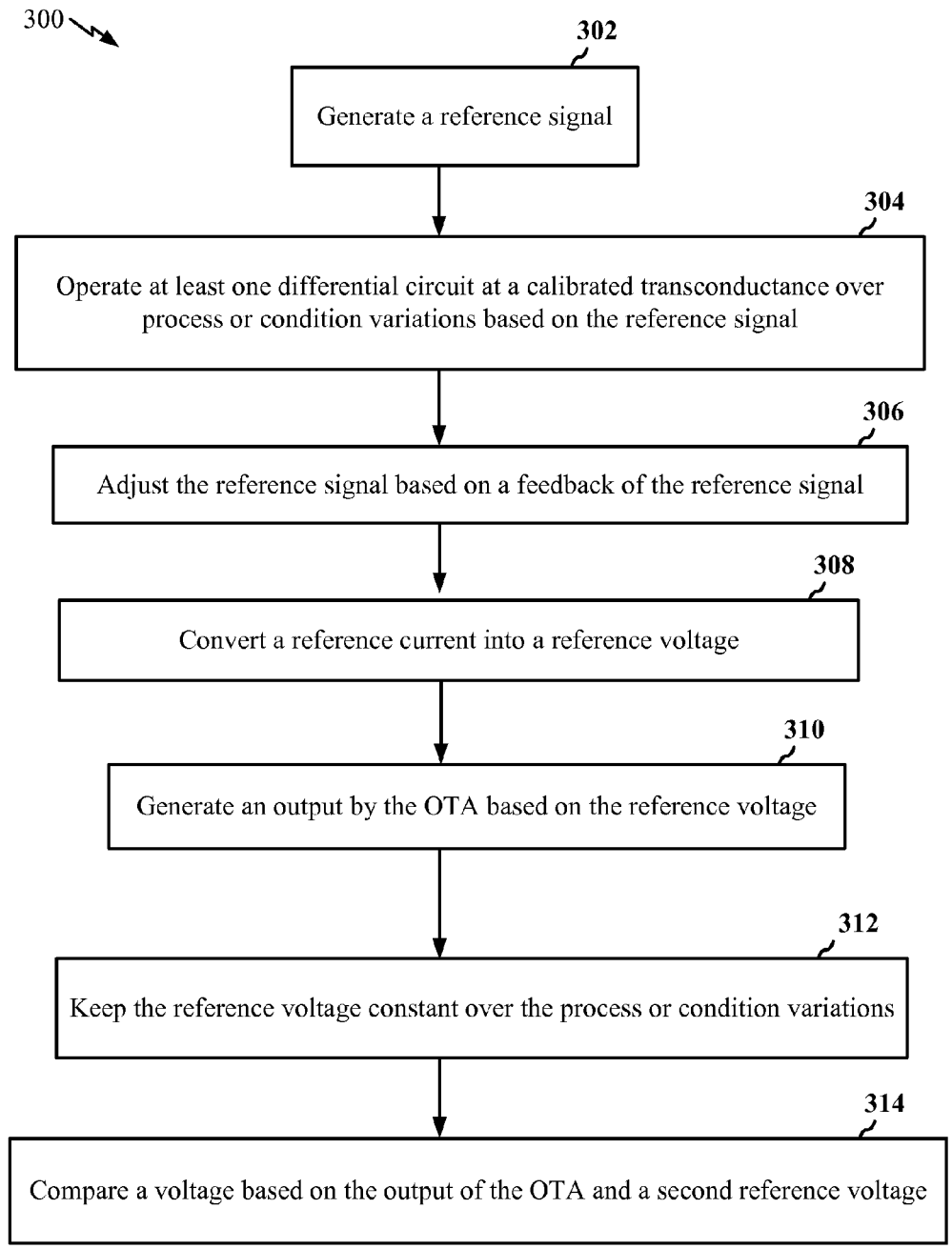
FIG. 3 is a flow chart of operations of an exemplary embodiment of a calibration circuit.

FIG. 3 is a flow chart 300 of operations of an exemplary embodiment of a calibration circuit 200. At 302, a reference signal is generated. At 304, at least one differential circuit operates at a calibrated transconductance over process or condition variations based on the reference signal. Referring to FIG. 1, the CML buffer 110 and the CTLE 120 are examples of differential circuits each incorporating a differential pair of transistors (112 and 122, respectively). Referring to FIG. 2 and the associated text, the calibration circuit 200 is an example of a circuit that generates a reference signal $V_{REF}$, which may be provided to the differential circuits (e.g., the CML buffer 110 and/or the CTLE 120) to generate a tail current in each of the circuits. Each of the differential circuits operates at a calibrated and constant transconductance over the PVT variations based on the reference signal $V_{REF}$. The calibration circuit 200 may generate the reference signal $V_{REF}$ based on a first reference current $I_P$ and a second reference current $I_0$. The reference signal $V_{REF}$ may be fed back to the calibration circuit to continuously adjust the output. The calibration circuit 200, in generating the reference signal $V_{REF}$, does not receive any feedback from and therefore, is independent from the operations of the differential circuits.

At 306, the reference signal is adjusted based on a feedback of the reference signal. The calibration circuit 200 may adjust the reference signal $V_{REF}$ by operations of the OTA 210 based on the feedback of the reference signal. Referring to FIG. 2 and the associated text, the transistor MN29 of the OTA 210 receives a feedback of the reference signal $V_{REF}$ and generates the tail current $I_{TAIL210}$ flowing through the differential pair of transistors MN21 and MN22. The OTA 210 generates outputs $I_{21}$ and $I_{22}$ based on the transconductance of the OTA 210, which in turn is based on the aforementioned tail current $I_{TAIL210}$.

In one example, the calibration circuit 200 may generate the reference signal $V_{REF}$ based on a first reference current (e.g., $I_P$) and a second reference current (e.g., $I_1$). At, 308, a reference current may be converted to a reference voltage. Referring to FIG. 2 and the associated text, the calibration circuit 200 utilizes the resistor $R_b$ to convert the current $I_P$ (e.g., the reference current or the first reference current) to the voltage $V_{IN}$ (e.g., the reference voltage), which is provided to the OTA 210 as an input voltage. At 310, an output may be generated by the OTA based on the reference voltage. Referring to FIG. 2 and the associated text, the OTA 210 generates the outputs $I_{21}$ and $I_{22}$ based on the voltage $V_{IN}$.

At 312, the reference voltage may be kept constant over the process or condition variations. Referring to FIG. 2 and the associated text, the current source 212 provides a current $I_P$, and a voltage $V_{IN}$ is generated based on the current $I_P$ and the resistance of the resistor $R_b$. The current $I_P$ may be generated from, for example, a bandgap voltage ($V_{bg}$) supply located off chip from the calibration circuit 200. This example is provided for demonstration only, and the scope of the present disclosure is certainly not limited thereto. As is known in the art, the bandgap voltage $V_{bg}$ is constant over PVT variations. In this example, the current $I_P$ may be described as follows:

$$I_P = V_{bg}/R_{on\text{-}chip},$$

where the resistance $R_{on\text{-}chip}$ is the on-chip portion of the resistance, including the resistor $R_b$. Since the resistance of the resistor $R_b$ is subject to PVT variations, the current $I_P$ likewise varies over the PVT variations. The resistor $R_b$ may be provided as a ratio of the total resistance $R_{on\text{-}chip}$ (e.g., a portion thereof). Thus, the resistance of the resistor $R_b$ may be expressed as:

$$R_b = K_b \times R_{on\text{-}chip},$$

where the $K_b$ is a constant (e.g., a ratio of $R_b$ to $R_{on\text{-}chip}$).

Accordingly, the voltage $V_{IN}$ may be expressed as $I_P \times R_b$ or as follows (substituting the expression for $I_P$ and $R_b$ shown above):

$$V_{IN}=K_b \times V_{bg}.$$

Accordingly, the voltage $V_{IN}$ may remain constant over the PVT variations.

At 314, a voltage based on the output of the OTA and a second reference voltage may be compared. Referring to FIG. 2 and the associated text, the operational amplifier 220 compares the voltage $V_1$ with the (second) reference voltage $V_0$ and generates as the output the reference signal $V_{REF}$. The voltage $V_1$ is generated based on the current $I_{21}$ and the current $I_{22}$ (and therefore, based on the outputs of the OTA 210). In one example, the second reference voltage (e.g., voltage $V_0$) may be based on the second reference current (e.g., current $I_0$), which may be constant over the process or condition variations.

The process described in connections with flow chart 300 may be applied to a case where the at least one differential circuit operates at a calibrated gain (e.g., step 304 provides that at least one differential circuit operates at a calibrated gain over process or condition variations based on the reference signal). When applied to the operating the at least one differential circuit at a calibrated gain, the second reference current (e.g., current $I_0$) needs not be constant over the process or condition variations (314).

Figure 4:
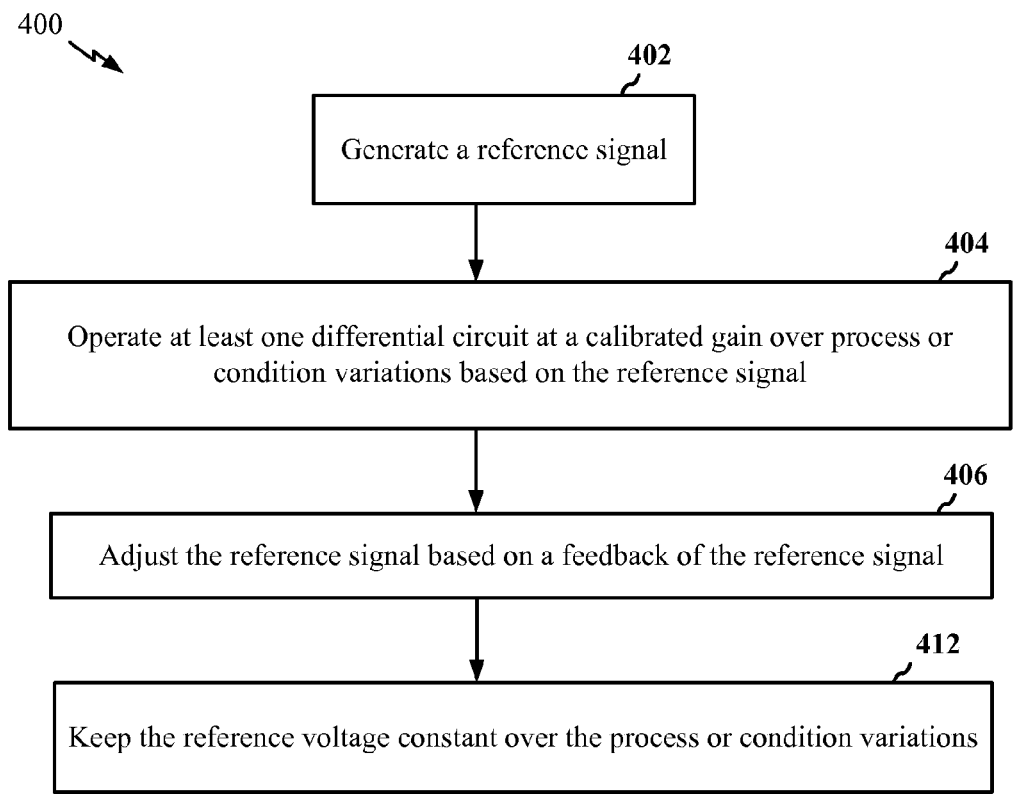
FIG. 4 is a flow chart of operations of another exemplary embodiment of a calibration circuit.

FIG. 4 is a flow chart 400 of operations of another exemplary embodiment of a calibration circuit 200. At 402, a reference signal is generated. At 404, at least one differential circuit operates at a calibrated transconductance over process or condition variations based on the reference signal. Referring to FIG. 1, the CML buffer 110 and the CTLE 120 are examples of differential circuits each incorporating a differential pair of transistors (112 and 122, respectively). Referring to FIG. 2 and the associated text, the calibration circuit 200 is an example of a circuit that generates a reference signal $V_{REF}$, which may be provided to the differential circuits (e.g., the CML buffer 110 and/or the CTLE 120) to generate a tail current in each of the circuits. Each of the differential circuits operates at a calibrated and constant transconductance over the PVT variations based on the reference signal $V_{REF}$. The calibration circuit 200 may generate the reference signal $V_{REF}$ based on a first reference current $I_P$ and a second reference current $I_0$. The reference signal $V_{REF}$ may be fed back to the calibration circuit to continuously adjust the output. The calibration circuit 200, in generating the reference signal $V_{REF}$, does not receive any feedback from and therefore, is independent from the operations of the differential circuits.

At 406, the reference signal is adjusted based on a feedback of the reference signal. The calibration circuit 200 may adjust the reference signal $V_{REF}$ by operations of the OTA 210 based on the feedback of the reference signal. Referring to FIG. 2 and the associated text, the transistor MN29 of the OTA 210 receives a feedback of the reference signal $V_{REF}$ and generates the tail current $I_{TAIL210}$ flowing through the differential pair of transistors MN21 and MN22. The OTA 210 generates outputs $I_{21}$ and $I_{22}$ based on the transconductance of the OTA 210, which in turn is based on the aforementioned tail current $I_{TAIL210}$.

In one example, the calibration circuit 200 may generate the reference signal $V_{REF}$ based on a reference voltage $V_{IN}$, which in turn is generated based on the based on a reference current (e.g., $I_P$). Referring to FIG. 2 and the associated text, the calibration circuit 200 utilizes the resistor $R_b$ to convert the current $I_P$ (e.g., the reference current or the first reference current) to the voltage $V_{IN}$ (e.g., the reference voltage), which is provided to the OTA 210 as an input voltage. The OTA 210 generates the outputs $I_{21}$ and $I_{22}$ based on the voltage $V_{IN}$.

At 412, the reference voltage may be kept constant over the process or condition variations. Referring to FIG. 2 and the associated text, the current source 212 provides a current $I_P$, and a voltage $V_{IN}$ is generated based on the current $I_P$ and the resistance of the resistor $R_b$. The current $I_P$ may be generated from, for example, a bandgap voltage ($V_{bg}$) supply located off chip from the calibration circuit 200. This example is provided for demonstration only, and the scope of the present disclosure is certainly not limited thereto. As is known in the art, the bandgap voltage $V_{bg}$ is constant over PVT variations. In this example, the current $I_P$ may be described as follows:

$$I_P=V_{bg}/R_{on\text{-}chip},$$

where the resistance $R_{on\text{-}chip}$ is the on-chip portion of the resistance, including the resistor $R_b$. Since the resistance of the resistor $R_b$ is subject to PVT variations, the current $I_P$ likewise varies over the PVT variations. The resistor $R_b$ may be provided as a ratio of the total resistance $R_{on\text{-}chip}$ (e.g., a portion thereof). Thus, the resistance of the resistor $R_b$ may be expressed as:

$$R_b=K_b \times R_{on\text{-}chip},$$

where the $K_b$ is a constant (e.g., a ratio of $R_b$ to $R_{on\text{-}chip}$).

Accordingly, the voltage $V_{IN}$ may be expressed as $I_P \times R_b$ or as follows (substituting the expression for $I_P$ and $R_b$ shown above):

$$V_{IN}=K_b \times V_{bg}.$$

Accordingly, the voltage $V_{IN}$ may remain constant over the PVT variations.

The process described in connections with flow chart 400 may be applied to a case where the at least one differential circuit operates at a calibrated transconductance (e.g., step 304 provides that at least one differential circuit operates at a calibrated transconductance over process or condition variations based on the reference signal).

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented. The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims. For example, the steps may be implemented by circuits to perform the functions described herein and/or circuits generating the signals for the functions described herein, or combinations thereof.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f), unless the element is expressly recited using the phrase "means for" or, in the case of a method claim, the element is recited using the phrase "step for.

What is claimed is:

1. An apparatus, comprising:
a calibration circuit configured to generate a reference signal; and
at least one differential circuit each being configured to operate at a calibrated transconductance over process or condition variations based on the reference signal,
wherein the calibration circuit is further configured to generate the reference signal independent of the at least one differential circuit and to provide a feedback of the reference signal and adjust the reference signal based on the feedback, wherein the calibration circuit further comprises an operational transconductance amplifier (OTA) configured to generate a tail current based on the feedback.

2. The apparatus of claim 1, wherein each of the at least one differential circuit comprises a differential pair of transistors, and wherein each of the at least one differential circuit is further configured to generate a tail current for its respective differential pair of transistors based on the reference signal.

3. The apparatus of claim 1, wherein the calibration circuit is further configured to generate the reference signal based on a first reference current and a second reference current.

4. The apparatus of claim 1, wherein the calibration circuit further comprises a circuit configured to convert a reference current into a reference voltage, and wherein the OTA is further configured to generate an output based on the reference voltage.

5. The apparatus of claim 4, wherein the calibration circuit is further configured to keep the reference voltage constant over the process or condition variations.

6. The apparatus of claim 5, wherein the calibration circuit further comprises an operational amplifier configured to compare a voltage based on the output of the OTA and a second reference voltage, wherein the calibration circuit is configured to generate the reference signal based on the comparison.

7. The apparatus of claim 6, wherein the second reference voltage is based on a second reference current, and wherein the second reference current is constant over the process or condition variations.

8. A method for operating at least one differential circuit, comprising:
generating a reference signal;
operating the at least one differential circuit at a calibrated transconductance over process or condition variations based on the reference signal,
wherein the reference signal is generated independently of the at least one differential circuit; and
adjusting the reference signal based on a feedback of the reference signal, wherein the reference signal is generated using an operational transconductance amplifier (OTA) having a tail current based on the feedback.

9. The method of claim 8, wherein each of the at least one differential circuit comprises a differential pair of transistors, and wherein the at least one differential circuit is operated with a tail current through the differential pair of transistors based on the reference signal.

10. The method of claim 8, wherein the reference signal is generated based on a first reference current and a second reference current.

11. The method of claim 8, wherein the generating the reference signal further comprises:
converting a reference current into a reference voltage, and
generating an output by the OTA based on the reference voltage.

12. The method of claim 11, wherein the generating the reference signal further comprises keeping the reference voltage constant over the process or condition variations.

13. The method of claim 12, wherein the generating the reference signal further comprises
comparing a voltage based on the output of the OTA and a second reference voltage, the reference signal being based on the comparison.

14. The method of claim 13, wherein the second reference voltage is based on a second reference current, and wherein the second reference current is constant over the process or condition variations.

15. An apparatus, comprising:
a calibration circuit configured to generate a reference signal; and
at least two types of differential circuits each being configured to operate at a calibrated gain over process or condition variations based on the reference signal,
wherein the at least two types of differential circuits comprise a buffer circuit and a differential circuit configured to receive an output of the buffer circuit,
wherein the calibration circuit is configured to generate the reference signal without receiving a feedback from the at least two types of differential circuits.

16. The apparatus of claim 15, wherein each of the two types of differential circuits comprises a differential pair of transistors, and is further configured to generate a tail current for the differential pair of transistors based on the reference signal.

17. The apparatus of claim 15, wherein the calibration circuit is further configured to feedback the reference signal and adjust the reference signal based on the feedback.

18. The apparatus of claim 15, wherein the calibration circuit is further configured to generate the reference signal based on a reference voltage and keep the reference voltage constant over the process or condition variations.

19. The apparatus of claim 18, wherein the reference voltage is based on a reference current, and the calibrated gain is proportional to the reference current.

20. A method for operating at least two types of differential circuits, comprising:
generating a reference signal; and
operating the at least two types of differential circuits at a calibrated gain over process or condition variations based on the reference signal,
wherein the at least two types of differential circuits comprise a buffer circuit and a differential circuit configured to receive an output of the buffer circuit, wherein the reference signal is generated without receiving a feedback from the at least two types of differential circuits.

21. The method of claim 20, wherein each of the at least two types of differential circuits comprises a differential pair of transistors, and is operated with a tail current through the differential pair of transistors based on the reference signal.

22. The method of claim 20, further comprising adjusting the reference signal based on a feedback of the reference signal.

23. The method of claim 20, wherein the generating the reference signal is based on a reference voltage, further comprising keeping the reference voltage constant over the process or condition variations.

24. The method of claim 23, wherein the reference voltage is based on a reference current, and the calibrated gain is proportional to the reference current.

* * * * *